(12) United States Patent
Xia et al.

(10) Patent No.: US 7,385,825 B2
(45) Date of Patent: Jun. 10, 2008

(54) HEAT DISSIPATION DEVICE

(75) Inventors: Wan-Lin Xia, Shenzhen (CN); Tao Li, Shenzhen (CN); Min-Qi Xiao, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/309,836

(22) Filed: Oct. 9, 2006

(65) Prior Publication Data
US 2008/0084669 A1 Apr. 10, 2008

(51) Int. Cl.
*H05K 7/20* (2006.01)

(52) U.S. Cl. ............... 361/719; 361/704; 257/718; 174/16.3; 165/80.3

(58) Field of Classification Search ............... None
See application file for complete search history.

(56) References Cited

U.S. PATENT DOCUMENTS

| | | | |
|---|---|---|---|
| 5,579,205 A | * | 11/1996 | Tustaniwskyj et al. ..... 361/704 |
| 5,590,025 A | * | 12/1996 | Clemens .................... 361/695 |
| 6,344,971 B1 | * | 2/2002 | Ju .............................. 361/704 |
| 6,449,154 B1 | | 9/2002 | Yoneyama et al. |
| 6,473,306 B2 | * | 10/2002 | Koseki et al. .............. 361/704 |
| 6,570,763 B1 | * | 5/2003 | McHugh et al. ........... 361/704 |
| 6,618,253 B1 | * | 9/2003 | Szu et al. ................... 361/719 |
| 6,648,664 B1 | * | 11/2003 | McHugh et al. ........... 439/331 |
| 6,717,814 B2 | * | 4/2004 | Li .............................. 361/704 |
| 6,785,136 B2 | * | 8/2004 | Chang et al. ............... 361/704 |
| 2005/0117306 A1 | | 6/2005 | Lee et al. |
| 2005/0174739 A1 | * | 8/2005 | Chen et al. ................. 361/704 |

* cited by examiner

*Primary Examiner*—Boris L Chervinsky
(74) *Attorney, Agent, or Firm*—Jeffrey T. Knapp (57) ABSTRACT

A heat dissipation device includes a heat sink defining a pair of cutouts at two opposite sides thereof. The heat sink includes two pads fixed in the cutouts, respectively. Each pad defines a slot therein. A retention module supports the heat sink thereon, and extends a pair of clamping arms in the cutouts of the heat sink. Each clamping arm defines a slit. A clip includes two abutting portions rotatablely connecting with the pads and the clamping arms, and two pressing portions slidably received in the slots of the pads and the slits of the clamping arms. When the clip is moved to a locked position, the pressing portions of the clip press the pads downwardly a distance relative to the clamping arms so that the heat sink can have an intimate contact with an electronic device.

20 Claims, 6 Drawing Sheets

HEAT DISSIPATION DEVICE

FIELD OF THE INVENTION

The present invention relates generally to heat dissipation devices, and more particularly to a heat dissipation device incorporating a locking device for securing the heat dissipation device to a heat-generating electronic device.

DESCRIPTION OF RELATED ART

With advancement of computer technology, electronic devices operate at a high speed. It is well known that the more rapidly the electronic devices operate, the more heat they generate. If the heat is not dissipated duly, the stability of the operation of the electronic devices will be impacted severely. Generally, in order to ensure the electronic device to run normally, a heat dissipation device is used to dissipate the heat generated by the electronic device. And in order to keep the heat dissipation device intimately contacting the electronic device, a locking device is usually desired for the heat dissipation device to secure the heat dissipation device to the electronic device.

Typically, a locking device comprising a strip-shaped clip and a retention module is used widely. The clip is formed by stamping a metal sheet and has two ends thereof forming two locking portions respectively. The retention module is located around the electronic device. The retention module comprises retaining members for engaging with the locking portions of the clip. In use, the clip spans in a groove defined in a heat sink of the heat dissipation device resting on the electronic device. The locking portions of the clip are engaged with the retaining members of the retention module. Here, the clip is deformed and presses the heat sink to intimately contact with the electronic device. However, during the attachment of the heat sink to the electronic device, it is considerably laborious to overcome the rigidity of the clip to engage the locking portions with the retaining members of the retention module. So, it is inconvenient during the assembling operation.

What is needed, therefore, is a heat dissipation device incorporating a locking device which can secure the heat dissipation device to a heat generating device conveniently.

SUMMARY OF THE INVENTION

A heat dissipation device in accordance an embodiment of the present invention comprises a heat sink defining a pair of cutouts at two opposite sides thereof. The heat sink comprises two pads fixed in the pair of cutouts respectively. The pads each define a first slot and a second slot therein. A retention module supports the heat sink thereon. The retention module extends a pair of clamping arms received in corresponding cutouts of the heat sink. The clamping arms each define a first slit and a second slit respectively corresponding to the first slot and the second slot of the pad of the heat sink. A clip comprises a pair of clipping portions and an operating portion connecting the pair of connecting clipping portions. Each clipping portion comprises an abutting portion rotatably received in a corresponding second slot of the pad of the heat sink and a corresponding second slit of the clamping arm of the retention module, and a pressing portion slidably received in a corresponding first slot of the pad of the heat sink and a corresponding first slit of the clamping arm of the retention module. When the clip is moved from an unlocked position to a locked position, the pressing portions press downward the pads and accordingly the heat sink a distance relative to the clamping arms and accordingly the retention module, whereby the heat sink can have an intimate contact with an electronic component surrounded by the retention frame.

Other advantages and novel features will become more apparent from the following detailed description of preferred embodiments when taken in conjunction with the accompanying drawings, in which:

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION OF THE INVENTION

Figure 1:
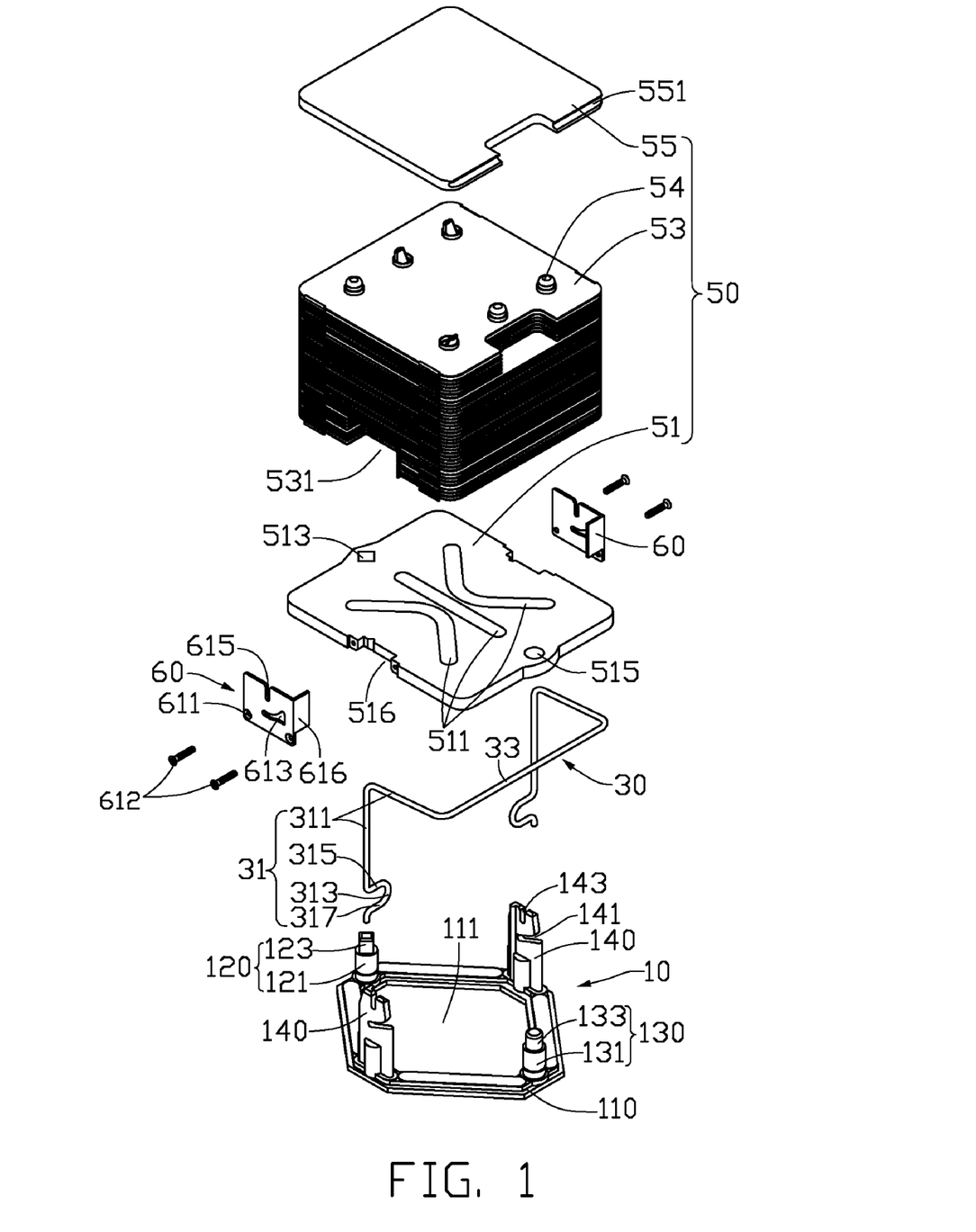
FIG. 1 is an exploded, isometric view of a heat dissipation device in accordance with a preferred embodiment of the present invention.
Figure 2:
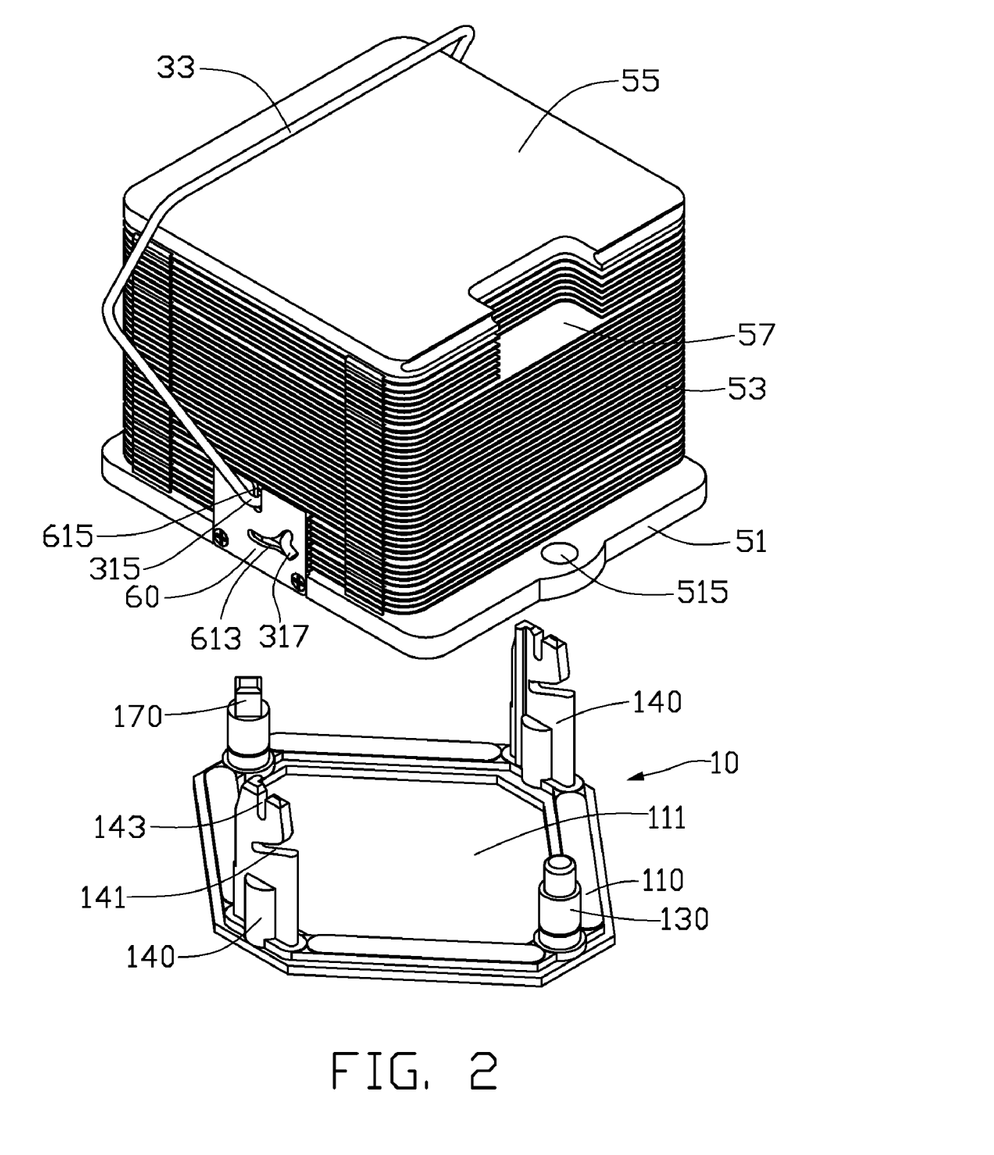
FIG. 2 is a partial assembled view of FIG. 1.

Referring to FIGS. 1 and 2, a heat dissipation device in accordance with a preferred embodiment of the present invention is shown. The heat dissipation device comprises a heat sink 50, a retention module 10, and a clip 30 cooperating with the retention module 10 to retain the heat sink 50 to an electronic device (not shown) located on a printed circuit board (not shown).

The heat sink 50 comprises a base 51, a fin set 53 located on the base 51, a top plate 55 located on the fin set 53, and a plurality of heat pipes 54 thermally connecting with the base 51, the fin set 53 and the top plate 55.

The base 51 of the heat sink 50 is a substantially rectangular plate with good heat conductivity. The base 51 has a bottom face for contacting the electronic device and a top face having the fin set 53 positioned thereon. The base 51 defines three grooves 511 in a substantially central portion of the top face thereof, wherein one of grooves 511 is straight, and two ones of the three grooves 511 are substantially L-shaped in profile and oppositely located at opposite sides of the straight one. The two L-shaped ones of the grooves 511 are symmetrical about the straight one of the grooves 511. Middle portions of two opposite edges of the base 51 protrude outwardly and define a first positioning hole 513 and a second positioning hole 515 therein, respectively. The first positioning hole 513 is substantially rectangular in shape. The second positioning hole 515 is substantially circular in shape. Middle portions of another two opposite edges of the base 51 are cut off to define two positioning notches 516, respectively. Two fixing holes (not labeled) are defined in two opposite sides of each notch 516 in the edge of the base 51, respectively. The heat sink 50 further comprises two clamping pads 60 having lower portions fixed in the notches 516 of the base 51. The clamping pad 60 is substantially rectangular and defines two through apertures 611 in two lower corners thereof. Two bolts 612 extend through the apertures 611 of the clamping pad 60 and screw in the fixing holes of the base 51 to fix the clamping pad 60 in the notch 516 of the base 51. The pad 60 defines a first slot 613 above the base 51 and a second slot 615 above the first slot 615. The first slot 613 substantially extends along at horizontal direction, and starts from a first end (not labeled, right end as viewed from FIG. 1) adjacent a first side of the pad 60 to terminate at a second end (not labeled, left end as viewed from FIG. 1) substantially just beyond a center of the clamping pad 60. The first slot 613 is gradually enlarged from the second end to the first end thereof, with a horizontal bottom side (not labeled) and a curved upper side (not labeled). The second slot 615 starts from a top edge of the clamping pad 60 and ends a distance above the second end of the first slot 613. A tab 616 perpendicularly extends toward the fins 53 from the first side of the clamping pad 60, and is located above the base 51.

The fin set 53 comprises a plurality of fins (not labeled) horizontally stacked one by one along a vertical direction. The fin set 53 defines three pairs of channels (not labeled) thermally accommodating upper portions of the heat pipes 54 therein. The heat pipes 54 have lower portions thereof thermally received in the grooves 511 of the base 51. Corresponding to the pads 60, the fin set 53 defines two cutouts 531 in lower portions of middles of two opposites sides thereof. The cutouts 531 are in communication with the corresponding notches 516 of the base 51. The tabs 616 of the pads 60 are received in corresponding cutouts 531 of the fin set 53 and abut the fin set 53. The top plate 55 is thermally located on the fin set 53. A lateral edge of the top plate 55 defines a positioning groove 551 therein for receiving an operating portion 33 of the clip 30 therein when the clip 30 is moved to a locked position. A recess 57 is defined in a middle portion of the lateral edge of the top plate 55 in which the groove 551 is defined, and several top fins of the fin set 53, for facilitating a user to operate the clip 30.

The retention module 10 is located around the electronic device on the circuit board, and comprises a substantially octagonal frame 110 with four longer borders (not labeled) and four shorter boarders (not labeled) alternating with the longer boarders. An opening 111 is surrounded by the frame 110. The electronic device is exposed in the opening 111 of the frame 110. A first post 120 and a second post 130 extend upwardly from two opposite ones of the shorter boarders of the frame 110. The first post 120 has a cylindrical lower portion 121 and a prism-shaped first positioning portion 123 extending upwardly from the lower portion 121. The first positioning portion 123 is to be fittingly received in first hole 513 of the base 51 with the lower portion 121 abutting against a bottom surface (not labeled) of the base 51. The second post 130 has a cylindrical lower portion 131 and a cylindrical second positioning portion 133 extending upwardly from the lower portion 131. The second positioning portion 133 of the second post 130 is to be fitted in the second hole 515 of the base 51 with the lower portion 131 abutting against the bottom surface of the base 51. A pair of flat locking arms 140 extends upwardly from another two opposite ones of the shorter boarders of the frame 110. Each of the locking arms 140 defines a first slit 141 in an upper portion thereof. The first slit 141 starts from a lateral edge of the locking arm 140 and ends at a position adjacent to a middle of the locking arm 140. The first slit 141 slants downwardly and inwardly from the lateral edge to the middle of the locking arm 140. A length of the first slit 141 is substantially equal to that of the first slot 613 of the pad 60. A vertical second slit 143 is defined above the first slit 141 and extends from a middle of a top edge of the locking arm 140 downwardly toward an inner end of the first slit 141. A length of the second slit 143 is substantially equal to that of the second slot 615 of the pad 60.

The clip 30 is made by bending a metal wire and comprises a pair of clipping portions 31 interconnected by the operating portion 33. Each clipping portion 31 consists of a connecting beam 311 and a retaining portion (not labeled) formed at a distal end of the connecting beam 311. The retaining portion comprises an abutting portion 315 and a pressing portion 317 having a horizontal portion (not labeled) substantially parallel to the abutting portion 315 and a distal portion (not labeled) bent downwardly from the horizontal portion, and an arc-shaped connecting portion 313 interconnecting the abutting portion 315 and the pressing portion 317. The operating portion 33 is substantially U-shaped and connects the two connecting beams 311 of the two clipping portions 31.

In assembly of the clip 30 and the heat sink 50, the two connecting beams 311 of the two clipping beams 31 of the clip 30 are positioned at two opposite sides of the fin set 53 of the heat sink 50. The abutting portions 315 of the pair of clipping portions 31 are received in corresponding second slots 615 of the pads 60. Distal end portions of the pressing portions 317 extend through the corresponding first slots 613 of the pads 60 and are located outside of the corresponding pads 60. The pressing portions 317 are received in corresponding second slots 613 of the pads 60. The connecting portions 313 of the retaining portion 313 are located in corresponding cutouts 531 of the fin set 53. Therefore, the clip 30 is rotatably attached to the heat sink 50 about the abutting portions 315 in the corresponding second slots 615 of the pads 60. When the operating portion 33 of the clip 30 is rotated, the pressing portions 317 of the retaining portions 313 of the clip 30 slide between the first ends and second ends of the corresponding first slots 613 of the pads 60.

Figure 3:
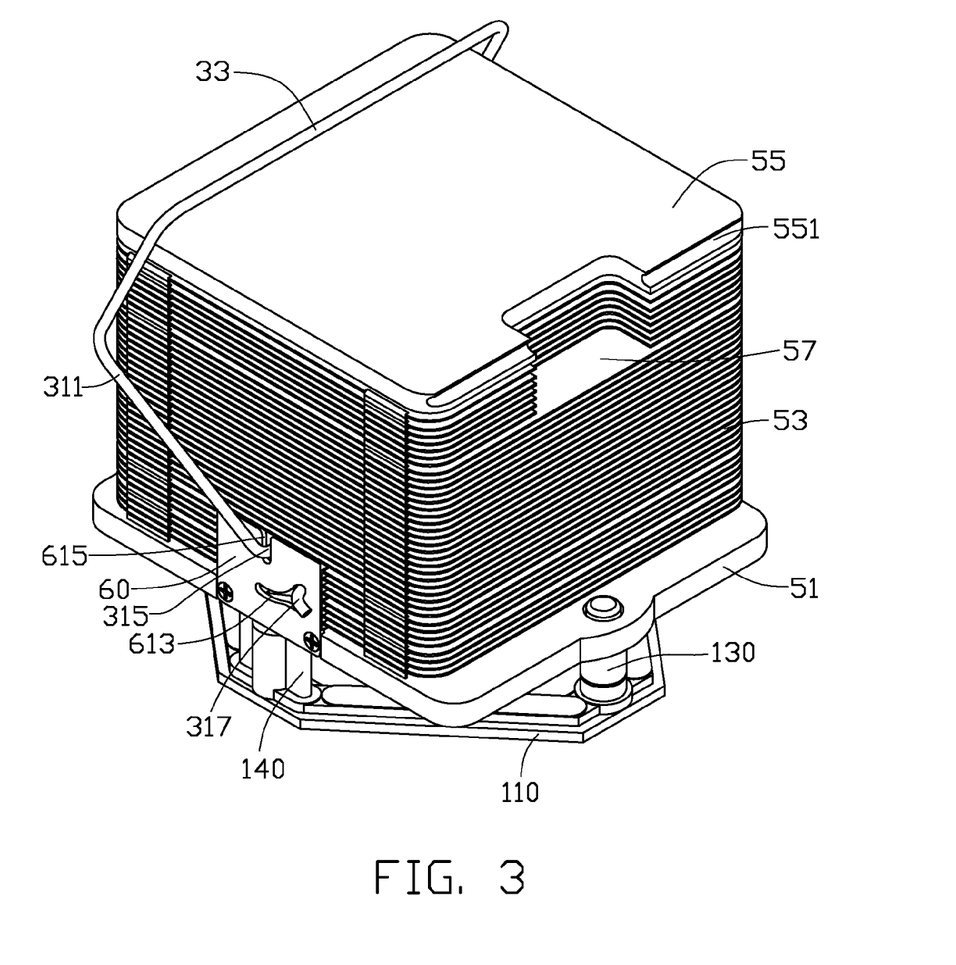
FIG. 3 is an assembled view of FIG. 1 with a clip in an unlocked position.
Figure 4:
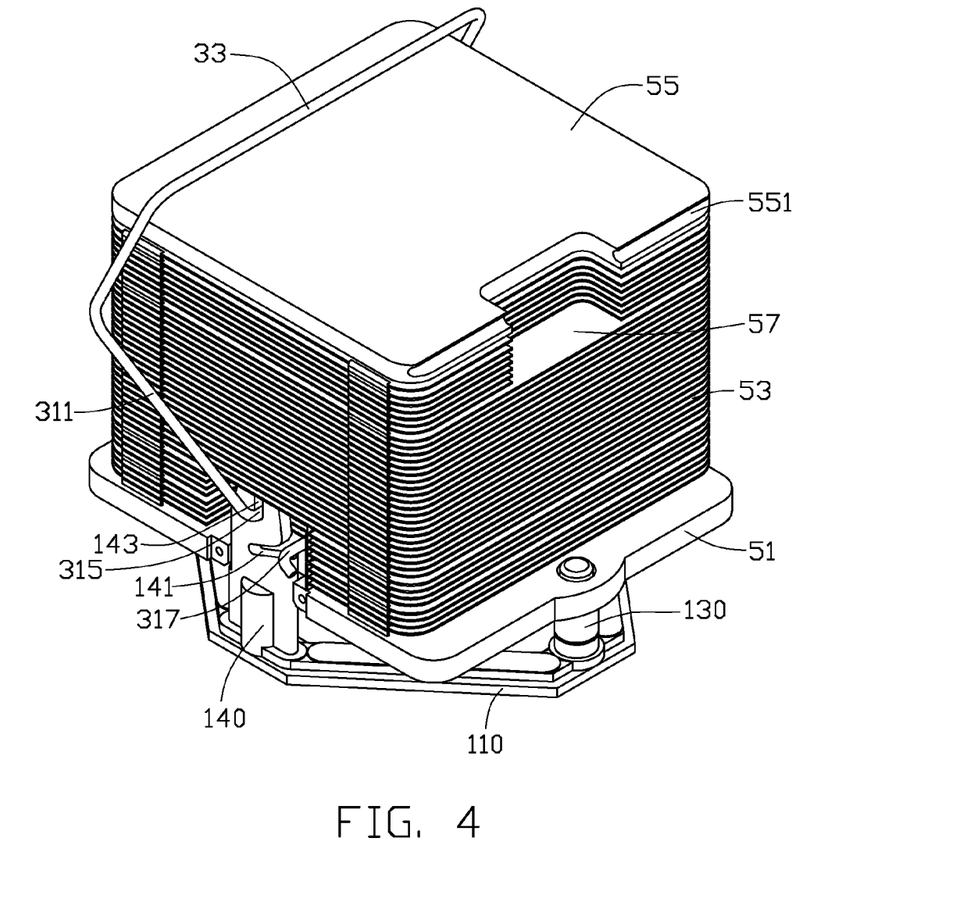
FIG. 4 is a similar view of FIG. 3 but without a clamping pad.

Referring to FIGS. 3-4, in assembly of the heat sink 50 with the clip 30 and the retention module 10 when the clip 30 is located at an unlocked position, the heat sink 50 is located on the retention module 10. The two arms 140 of the retention module 10 extend through the corresponding notches 516 of the base 51 and are received in the corresponding cutouts 531 of the fin set 53 of the heat sink 50. The abutting portions 315 of the clip 30 enter into corresponding second slits 143 of the arms 140 of the retention module 10. The first, second positioning portions 123, 133 of the first, second posts 120, 130 of the retention module 10 are slidably fitted into the first, second holes 513, 515 of the base 51 of the heat sink 50. The lower portions of the first, second posts 120, 130 of the retention module 10 support the heat sink 50 thereon. The pressing portions 317 of the retention portions 313 of the clip 30 are located outside and adjacent to entrances of the first slits 141 of the arms 140 of the retention module 10. The bottom surface of the base 51 of the heat sink 50 contacts the electronic device.

Figure 5:
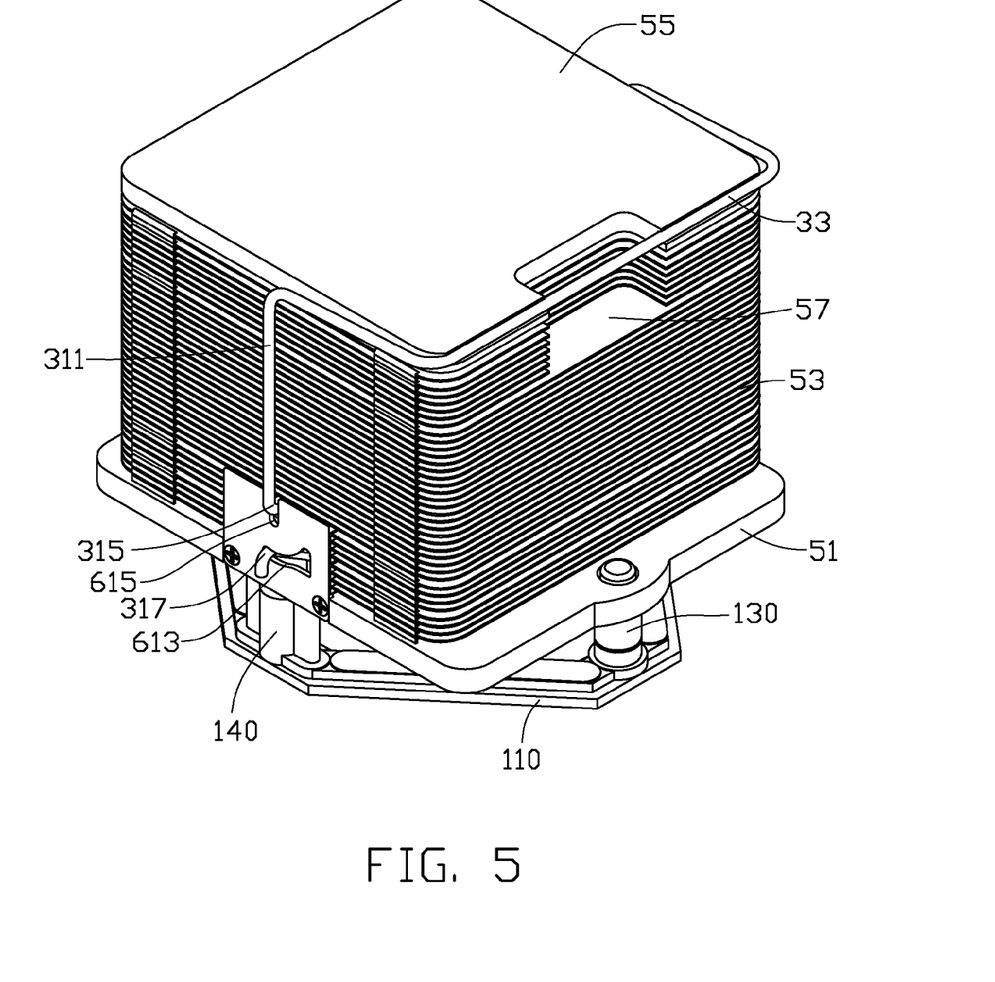
FIG. 5 is an assembled view of FIG. 1 with the clip in a locked position.
Figure 6:
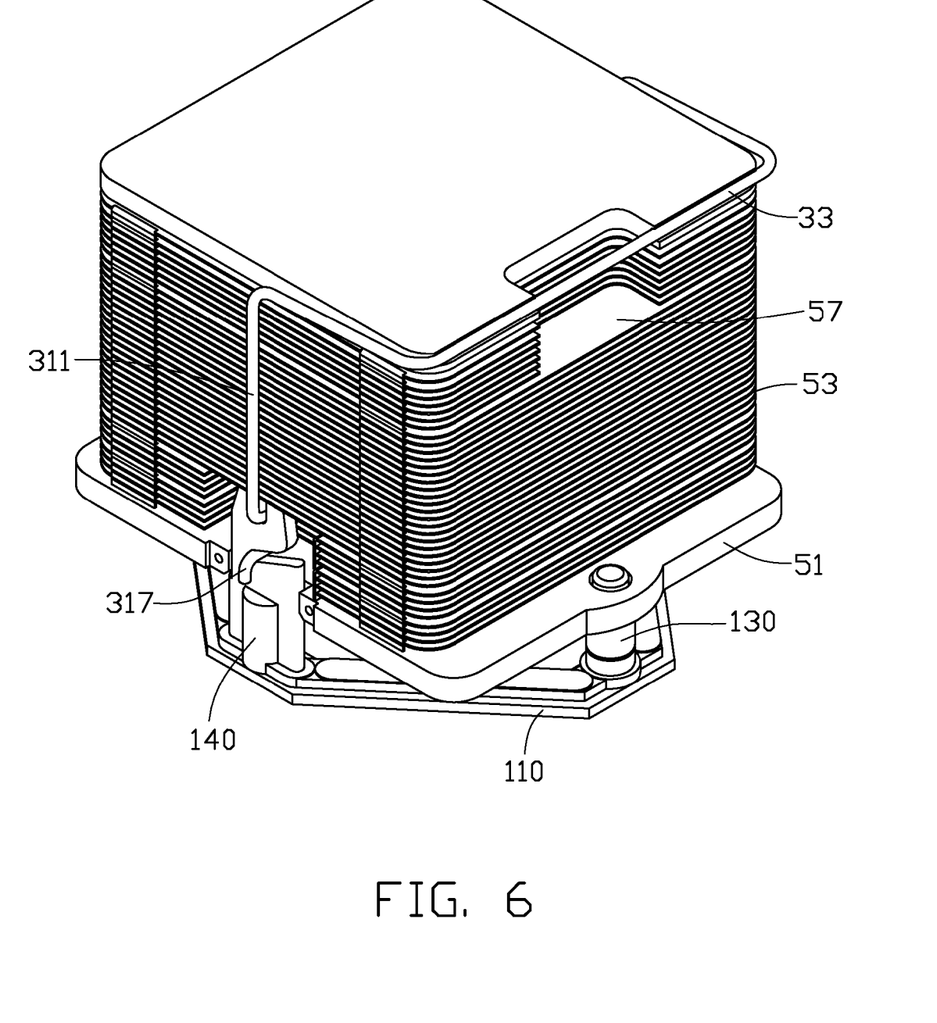
FIG. 6 is a similar view of FIG. 5 but without the clamping pad.

As illustrated in FIGS. 3 and 4, the heat dissipation device is in an unlocked position. The operating portion 33 of the clip 30 spans across the top plate 55 of the heat sink 50. The connecting beams 311 are oriented slantwise. The pressing portions 317 of the clip 30 are located outside the entrances of the corresponding first slits 141 of the arms 140 of the retention module 10 and in the first ends of the corresponding first slots 613 of the pads 60. The first slots 613 of the pads 60 are partially aligned with the corresponding first slits 141 of the arms 140 of the retention module 10 at the first ends of the first slots 613. The heat sink 50 is located on the retention module 10. Rotating the operating portion 33 of the clip 30 about the abutting portions 315 in the corresponding second slits 141 of the arms of the retention module 10 and the second slots 613 of the pads 60 from the unlocked position to a locked position as shown in FIGS. 5 and 6, the pressing portions 317 of the clip 30 side to the second ends of the first slots 613 of the pads 60 and the inner ends of the first slits 141 of the arms 140. Since the first slits 141 are slanted inwardly and downwardly, at the locked position, the pressing portions 317 of the clip 30 downwardly pressing the pads 60 at the second ends of the first slots 613; the pads 60 and accordingly the heat sink 50 are pressed downwardly a distance by the pressing portions 317 of the clip 30 relative to the arms 140 and accordingly the retention module 10 so that the bottom surface of the base 51 is moved downwardly to have an intimate contact with the electronic device. As illustrated in FIGS. 5 and 6, at the locked position, the operating portion 33 of the clip 30 reaches the lateral edge of the top plate 55 of the heat sink 50 and is engaged in the groove 551, the connecting beams 311 are oriented vertically.

To remove the heat sink 50 from the electronic device, the operating portion 33 of the clip 30 is disengaged from groove 551 of the heat sink 50, and then the operating portion 33 is rotated reversely to reach its original position as shown in FIG. 3. The pressing portions 317 of the clip 30 are moved to the first ends of the first slots 613 and released from pressing the pads 60 at the second ends of the first slots 613 of the clamping pads 60, and moved outside the first slits 141 of the arms 140. Thus, the heat sink 50 together with the clip 30 can be removed from the electronic device and the retention module 10.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device comprising:
a heat sink defining a pair of cutouts at two opposite sides thereof, the heat sink comprising two pads fixed in the pair of cutouts respectively, the pads each defining a first slot therein;
a retention module supporting the heat sink thereon, the retention module extending a pair of clamping arms received in the cutouts of the heat sink, respectively, the clamping arms each defining a first slit corresponding to the first slot of the each pad of the heat sink; and
a clip comprising two abutting portions rotatably connecting with corresponding pads of the heat sink and corresponding clamping arms of the retention module, and two pressing portions slidably received in the first slots of the pads of the heat sink and the first slits of the clamping arms of the retention module, wherein when the clip is moved from an unlocked position to a locked position, the pressing portions press the pads downwardly a distance relative to the clamping arms of the retention module so that the heat sink is moved downwardly a distance relative to the retention module.

2. The heat dissipation device of claim 1, wherein the pads each is located outside a corresponding clamping arm of the retention module.

3. The heat dissipation device of claim 2, wherein the pads of the heat sink each define a second slot, the abutting portions of the clip being rotatablely received in corresponding second slots of the pads of the heat sink.

4. The heat dissipation device of claim 3, wherein the clamping arms of the retention module each define a second slit, the abutting portions of the clip being rotatablely received in the second slits.

5. The heat dissipation device of claim 4, wherein the first slots of the pads of the heat sink are substantially horizontally defined in the pads, and each first slot starts at a first end and ends at an inner second end, the first slot gradually expanding from the second end to the first end.

6. The heat dissipation device of claim 5, wherein each of the first slits of the clamping arms of the retention module starts from a lateral edge of the clamping arm and ends at a position corresponding to the second end of the first slot of the pad of the heat sink, the first slit slants downwardly and inwardly from the lateral edge of the clamping arm.

7. The heat dissipation device of claim 5, wherein the second slot of the pad of the heat sink is substantially vertically defined in the pad, and starts from a top edge of the pad and ends at a position located a distance above the second end of the first slot of the pad.

8. The heat dissipation device of claim 7, wherein the second slit of the clamping arm of the retention module is corresponding to the second slot of the pad of the heat sink, and starts from a top edge of the clamping arm and ends at a position located a distance above the first slit of the clamping arm of the retention module.

9. The heat dissipation device of claim 1, wherein the clip is bent from a metal wire, and comprises two connecting portions interconnecting corresponding abutting portions and pressing portions, two connecting beams extending from the corresponding abutting portions, and an operating portion spanning over the heat sink and interconnecting the two connecting beams.

10. The heat dissipation device of claim 1, wherein the retention module extends a pair of positioning posts extending through the heat sink and supporting the heat sink thereon.

11. A heat dissipation device comprising:
a heat sink having two sides thereof each defining a first slot and a second slot therein;
a retention module extending a pair of clamping arms each defining a first slit and second slit respectively corresponding to the first slot and the second slot of the heat sink; and
a clip comprising a pair of clipping portions each having an abutting portion rotatablely engaged in a corresponding second slot of the heat sink and a corresponding second slit of the retention module and a pressing portion extending from the abutting portion and slidably received in a corresponding first slot of the heat sink and a corresponding first slit of the retention module, and an operating portion interconnecting the pair of clipping portions, wherein when the clip is moved for an unlocked position to a locked position, the pressing portions press downwardly the heat sink a distance relative to the retention module.

12. The heat dissipation device of claim 11, wherein the heat sink comprises a base and a fin set located on the base.

13. The heat dissipation device of claim 12, wherein the heat sink comprises a plurality of heat pipes thermally connecting the base and the fin set thereof.

14. The heat dissipation device of claim 11, wherein the base and the fin set cooperatively define a pair of cutouts therein, the pair of clamping arms of the retention module being received in the cutouts, respectively, a pair of pads being fixed to the base and located outside of the clamping arms, respectively.

15. The heat dissipation device of claim 14, wherein the first slot and the second slot are defined in the pad, the second slot being located above and substantially perpendicular to the first slot in the pad.

16. The heat dissipation device of claim 12, wherein the retention module extends a pair of posts slidably engaged in two holes defined in the base of the heat sink, respectively.

17. A heat dissipation device comprising:
a retention module adapted to be secured to a printed circuit and surround an electronic device on the printed circuit board, the retention module having a pair of retaining arms extending upwardly, each arm having a slit extending inwardly and downwardly from a lateral edge to a middle thereof;
a heat sink mounted on the retention module and having a bottom surface adapted for thermally connecting with the electronic device, the heat sink defining a pair of notches in middles of opposite sides thereof, wherein the retaining arms are inserted into the notches, respectively;
a pair of clamping pads secured in the notches and located outside of the retaining arms, respectively, each clamping pad defining a substantially horizontally slot therein; and
a clip having a middle, U-shaped operating portion, two connecting beams extending downwardly from two ends of the operating portion, two retaining portions each extending downwardly from a corresponding connecting beam, the each retaining portion having an upper abutting portion rotatably connected to a corresponding retaining arm and a corresponding clamping pad, and a lower pressing portion slidably received in a corresponding slot and a corresponding slit, wherein when the clip is moved from an unlocked position to a locked position, the pressing portion slides in the slot and the slit, moves from a position near the lateral edge of the retaining arm to an inner end of the slit and downwardly press the heat sink a distance relative to the retention module.

18. The heat dissipation device of claim 17, wherein at the unlocked position, the connecting beams are oriented slantwise, and at the locked position, the connecting beams are oriented vertically.

19. The heat dissipation device of claim 18, wherein the slot is gradually enlarged from an inner end toward an outer end thereof.

20. The heat dissipation device of claim 19, wherein the clip further comprises a pair of arc-shaped connecting portions each interconnecting a corresponding upper abutting portion and a corresponding lower pressing portion.

* * * * *